United States Patent [19]
Holm et al.

[11] Patent Number: 5,216,686
[45] Date of Patent: Jun. 1, 1993

[54] INTEGRATED HBT AND VCSEL STRUCTURE AND METHOD OF FABRICATION

[75] Inventors: Paige M. Holm, Phoenix; Donald E. Ackley, Paradise Valley, both of Ariz.

[73] Assignee: Motorola, Inc., Schaumburg, Ill.

[21] Appl. No.: 829,656

[22] Filed: Feb. 3, 1992

[51] Int. Cl.[5] .............................................. H01S 3/19
[52] U.S. Cl. ...................................... 372/45; 372/50; 372/96; 257/565
[58] Field of Search ............... 372/45, 50, 96; 357/34, 357/17, 19

[56] References Cited

U.S. PATENT DOCUMENTS

| | | | |
|---|---|---|---|
| 4,388,633 | 6/1983 | Vasudeu | 372/50 |
| 4,833,511 | 5/1989 | Sugimoto | 372/50 |
| 4,969,152 | 11/1990 | Burghardt et al. | 372/50 |
| 5,068,870 | 11/1991 | Yagi et al. | 372/50 |

FOREIGN PATENT DOCUMENTS 0134093 6/1986 Japan ....................... 372/50

OTHER PUBLICATIONS

Chan et al., "Optically Controlled Surface-Emitting Lasers," Appl. Phys. Lett., 58(21), May 27, 1991, pp. 2342-2344.

Mori et al., "Operation Principle of the InGaAsP/InP Laser Transistor", Appl. Phys. Lett., 47(7), Oct. 1, 1985, pp. 649-651.

Zhou et al., "Surface-Emitting Laser-Based Optical Bistake Switching Device", Appl. Phys. Lett., 59(21), Nov. 18, 1991, pp. 2648-2650.

Shibata et al., "Monolithic Integration of an InGaAsP-/InP Laser Diode with Heterojunction Bipolar Transistor," Appl. Phys. Lett. 45(3), Aug. 1, 1984, pp. 191-193.

Primary Examiner—Georgia Y. Epps
Attorney, Agent, or Firm—Miriam Jackson

[57] ABSTRACT

A vertical cavity surface emitting laser (VCSEL), comprised of a first ¼ wave stack, an active layer and a second ¼ wave stack, is integrated with a heterojunction bipolar transistor (HBT). The HBT is partially or fully positioned within either the first or the second ¼ wave stack of the VCSEL. This method improves the planarity of the device, thus allowing for high performance devices to be fabricated. A top or bottom emitting device may be fabricated with the second ¼ wave stack comprised of dielectric layers or semiconductor epitaxial layers.

21 Claims, 7 Drawing Sheets

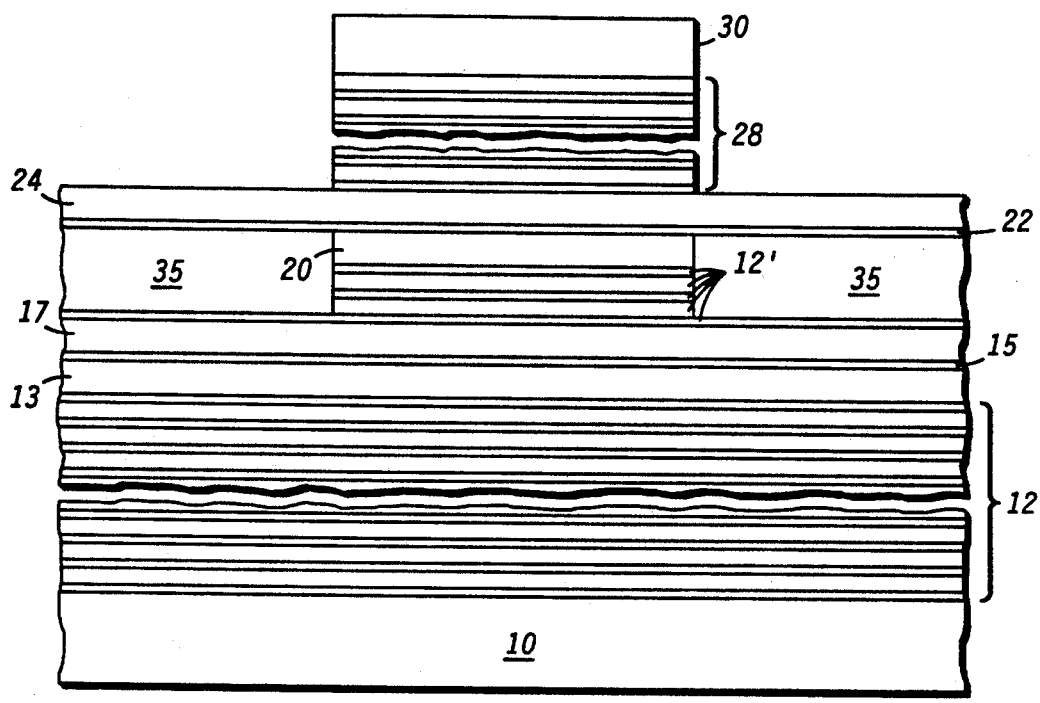
FIG. 5
FIG. 6
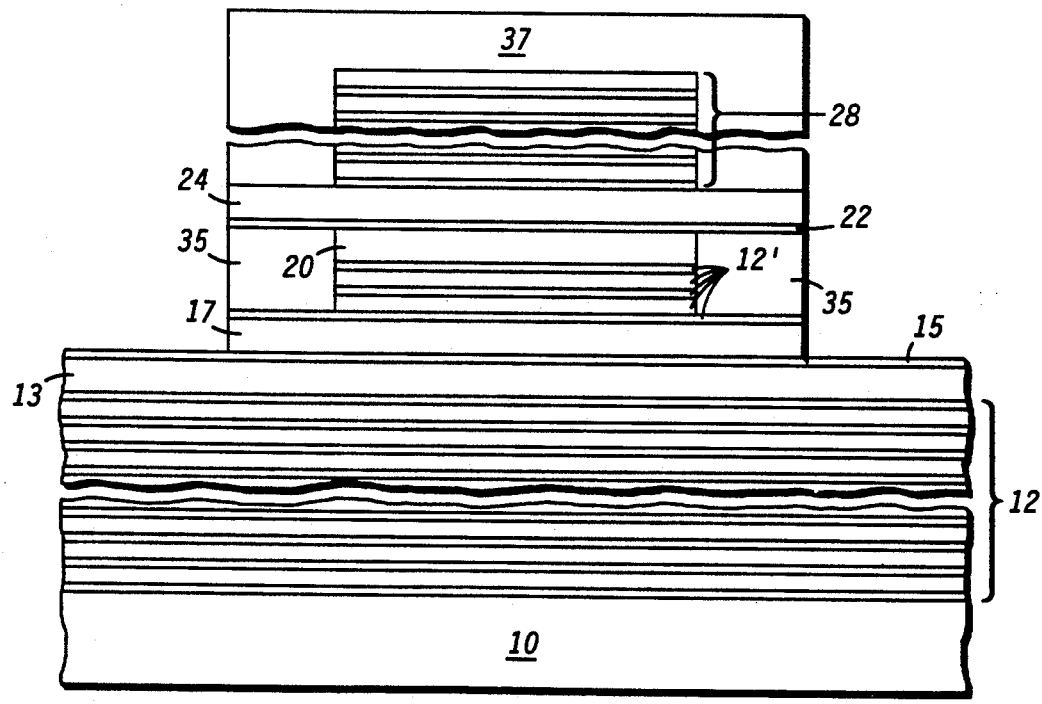

INTEGRATED HBT AND VCSEL STRUCTURE AND METHOD OF FABRICATION

BACKGROUND OF THE INVENTION

This invention relates, in general, to semiconductor devices and, including, but not limited to, a vertical cavity surface emitting laser (VCSEL) integrated with a heterojunction bipolar transistor (HBT).

There is a need to integrate electronic components with optical devices to provide for optoelectronic integrated circuits (OEICs). It would be desirable to integrate electronic components with lasers, in particular VCSELs. A problem encountered with integrating VCSELs with electronic components is that the highly non-planar structure of VCSELs makes it difficult to integrate electronic devices with them. The conventional integration approach is to provide a set of layers dedicated for the VCSEL on top of another set of layers dedicated for the electronic component on a single substrate. This approach forms a structure which exacerbates the problem of non-planarity of VCSELs.

Planar structures are desirable from a process and packaging point of view. Devices with high aspect ratio features make contact from the top of the device to the plateau of the device a very difficult processing problem. In addition, fine line lithography, which is necessary for high performance devices, is difficult to use in highly non-planar structures.

Thus, there exists a need to provide a means of integrating VCSELs with electronic components to make possible high performance, monolithic OEICs. A planar structure would facilitate the fabrication of these high performance circuits.

SUMMARY OF THE INVENTION

In accordance with the present invention, an integrated circuit, comprising a vertical cavity surface emitting laser comprised of a first and a second ¼ wave stack, and having a heterojunction bipolar transistor partially or fully positioned within the first or the second ¼ wave stack is fabricated.

BRIEF DESCRIPTION OF THE DRAWINGS

FIG. 5 illustrates an enlarged cross-sectional view of a third embodiment of the present invention in a beginning stage of fabrication;

FIG. 6 illustrates an enlarged cross-sectional view of the third embodiment of the present invention in a further stage of fabrication;

DETAILED DESCRIPTION OF THE DRAWINGS

Figure 1:
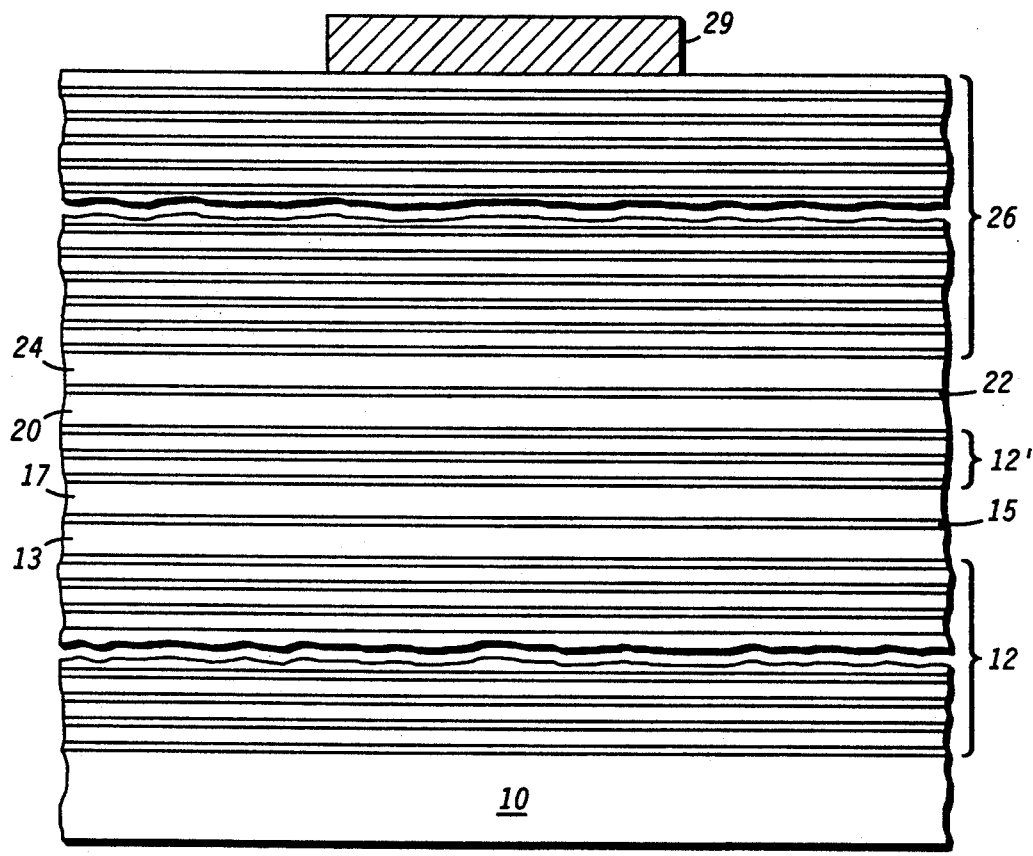
FIG. 1 illustrates an enlarged cross-sectional view of a first embodiment of the present invention in a beginning stage of fabrication.

FIG. 1 illustrates an enlarged cross-sectional view of a first embodiment of the present invention, an integrated HBT and VCSEL, in a beginning stage of fabrication. What is shown is a self-supporting structure 10 of a first conductivity type. In a preferred embodiment, self-supporting structure 10 is comprised of a n-type substrate. More preferably, self-supporting structure 10 is comprised of gallium arsenide and is doped n-type at approximately $10^8$ atoms/cm$^3$ with an n-type dopant such as silicon. Other suitable dopants may be used. Self-supporting structure 10 and subsequent semiconductor epitaxial layers may be comprised of other III–V semiconductor materials systems such as indium phosphide.

Formed on self-supporting structure 10 is a first portion of a first ¼ wave stack 12 of the VCSEL. A ¼ wave stack is also referred to as a mirror stack or distributed Bragg reflector in the art. First portion of first ¼ wave stack 12 is preferably of the first conductivity type.

Subsequently, layers of an HBT are formed on the first portion of first ¼ wave stack 12. The HBT is comprised of an emitter layer 13 of the first conductivity type formed on first portion of first ¼ wave stack 12, a base layer 15 of a second conductivity type formed on emitter layer 13, and a collector layer 17 of the first conductivity type formed on base layer 15.

Next, a second portion of first ¼ wave stack 12' is formed on collector layer 17. A VCSEL is typically fabricated to operate at a particular wavelength, called the lasing wavelength or wavelength of operation. The material used in the first and the second portions of first ¼ wave stack 12 and 12' and the HBT layers 13, 15, and 17 must be transparent at the lasing wavelength. In addition, the total thickness of the HBT layers is equal to a multiple of ¼ of the wavelength of operation divided by the refractive index.

In a preferred embodiment, first and second portions of first ¼ wave stack 12 and 12' are comprised of alternating layers of n-type aluminum arsenide (AlAs) and gallium arsenide (GaAs). The thickness and doping level of the HBT layers are chosen appropriately to achieve phase matching with first and second portions of first ¼ wave stack 12 and 12', because the HBT layers are actually a part of first and second portion of first ¼ wave stack 12 and 12'. In a preferred embodiment, emitter layer 13 and collector layer 17 are comprised of AlAs having a thickness of $(2n+1)\lambda_1/4$, where n=0, 1, 2, 3, ... and $\lambda_1$ is the lasing wavelength in AlAs. In the preferred embodiment, base layer 15 is comprised of GaAs also having a thickness of $(2n+1)\lambda_2/4$, where n=0, 1, 2, 3, ... and where $\lambda_2$ is the lasing wavelength in GaAs. Suitable second conductivity type dopants, such as zinc, may be used to make base layer 15 p-type.

The HBT layers, however, may be comprised of a material having a different bandgap from those of the layers of the first and second portions of ¼ wave stack 12 and 12', with appropriate changes made to the total thickness of the HBT layers to achieve phase matching with first and second portions of ¼ wave stack 12 and 12'. The number of periods or pairs of alternating layers of the first and the second portions of first ¼ wave stack 12 and 12' and emitter layer 13, base layer 15, and collector layer 17 determines the reflectivity of the device. Typically, the number of periods will be equal to 25 to 30.

On second portion of first ¼ wave stack 12', a first cladding layer 20 of the first conductivity type is formed. First cladding layer 20 is preferably comprised of aluminum gallium arsenide (AlGaAs). The position of the HBT layers, emitter layer 13, base layer 15, and collector layer 17, formed partially or fully within the first and second portions of first ¼ wave stack 12 and 12' may be varied. If the HBT layers are placed just below first cladding layer 20, a more planar structure can be fabricated. In an alternate embodiment, cladding layer 20 can even double as the collector layer of the HBT. If the HBT layers are placed further below cladding layer 20, deep within the first and second portions of first ¼ wave stack 12 and 12', a better waveguide would be produced, which would provide for stronger optical confinement and lower threshold currents. Although the position of emitter layer 13, base layer 15, and collector layer 17 is shown to be near cladding layer 20 in FIG. 1, the optimum position of these layers may lie somewhere in between, depending on the desired structural, electrical, and optical characteristics of the OEIC.

Subsequently, an active layer 22 of the second conductivity type is formed on first cladding layer 20. Active layer 22 is preferably comprised of barrier layers and at least one quantum well which is comprised of nominally undoped indium gallium arsenide (InGaAs). However, multiple quantum wells may be used. In addition, other materials, such as gallium arsenide, may be used for different operating wavelengths, with appropriate changes to the composition of optical cavity, which is comprised of first portion of first ¼ wave stack 12 and second ¼ wave stack 26 (described below) and all the layers between them, to maintain transparency. The formation of quantum well active layers and barriers is well known in the art. The total thickness of active layer 22 must be a multiple of ½ of the wavelength of operation in order for active layer 22 to fulfill phase matching requirements in the optical cavity.

A second cladding layer 24 of the second conductivity type is then formed on active layer 22. Second cladding layer 24 is preferably comprised of the same material as first cladding layer 20.

Thereafter, a second ¼ wave stack 26 of the second conductivity type is formed on second cladding layer 24. In a preferred embodiment, second ¼ wave stack 26 is comprised of the same material as first and second portions of ¼ wave stack 12 and 12', but doped of the second conductivity type.

Finally, a second conductivity type ohmic contact layer 29 is formed and patterned on second ¼ wave stack 26. Second conductivity type ohmic contact layer 29 also acts as an etch mask, as is seen below in FIG. 2.

Figure 2:
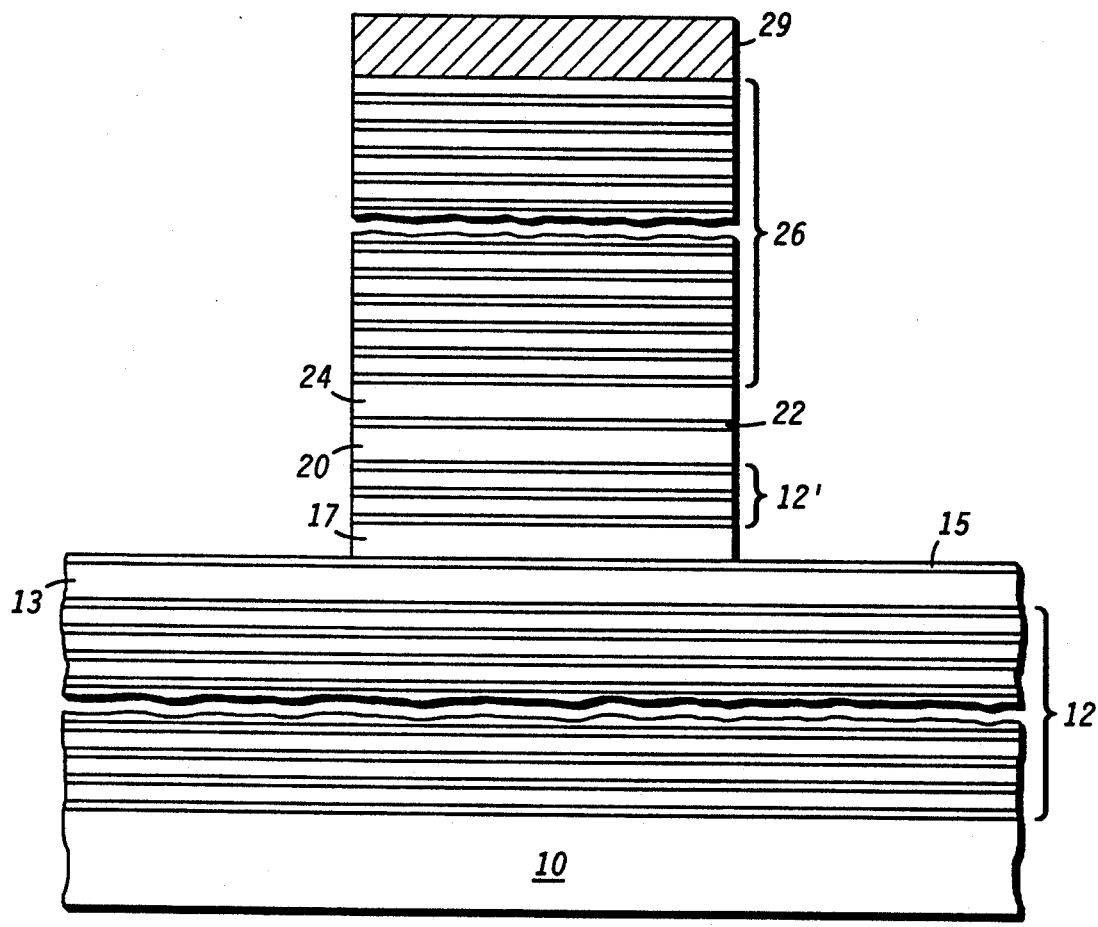
FIG. 2 illustrates an enlarged cross-sectional view of the first embodiment of the present invention in a further stage of fabrication.

FIG. 2 illustrates the structure of FIG. 1 in a further stage of fabrication. A portion of second ¼ wave stack 26, second cladding layer 24, first cladding layer 20, active layer 18, first cladding layer 20, second portion of ¼ wave stack 12', and collector layer 17 is removed utilizing second conductivity type ohmic contact layer 29 as a mask. The manner of etching of these layers to expose base layer 15 is well known in the art. The etching of these layers also determines the characteristics of the optical mode of the VCSEL. Thus, the position of the HBT indirectly affects the characteristics of the optical mode.

Figure 3:
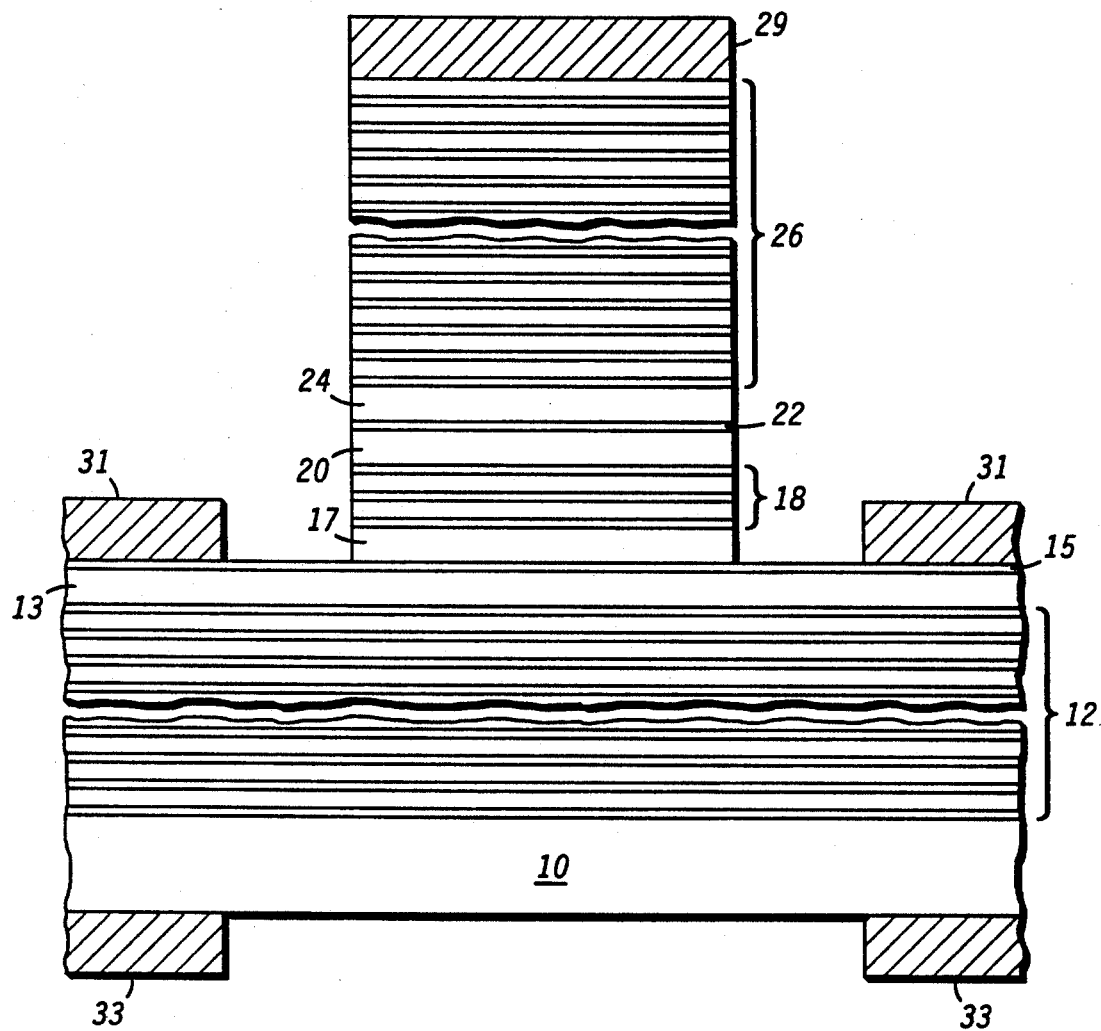
FIG. 3 illustrates an enlarged cross-sectional view of the first embodiment of the present invention in yet a further stage of fabrication.

FIG. 3 illustrates the structure of FIG. 2 in yet a further stage of fabrication. Base ohmic contacts 31 of the second conductivity type are formed and patterned on exposed portions of base layer 15. Emitter ohmic contacts 33 of the first conductivity type are formed and patterned on a portion of the exposed portion of self-supporting structure 10.

In this first embodiment, a bottom emitting device is formed wherein optical emission takes place through self-supporting structure 10 between emitter contacts 33. As can be seen, the HBT is positioned within the first and second portions of first ¼ wave stack 12 and 12' of the VCSEL. In the present invention, layers of the HBT also act as part of the layers of one of the ¼ wave stacks of the VCSEL. Layers for the HBT separate from the layers of the VCSEL are not necessary, thus simplifying the process and increasing the planarity of the device. Because the HBT layers also function as part of one of the ¼ wave stacks, a structure more planar than prior art devices can be fabricated. The more planar structure allows for high performance circuits to be fabricated.

Figure 4:
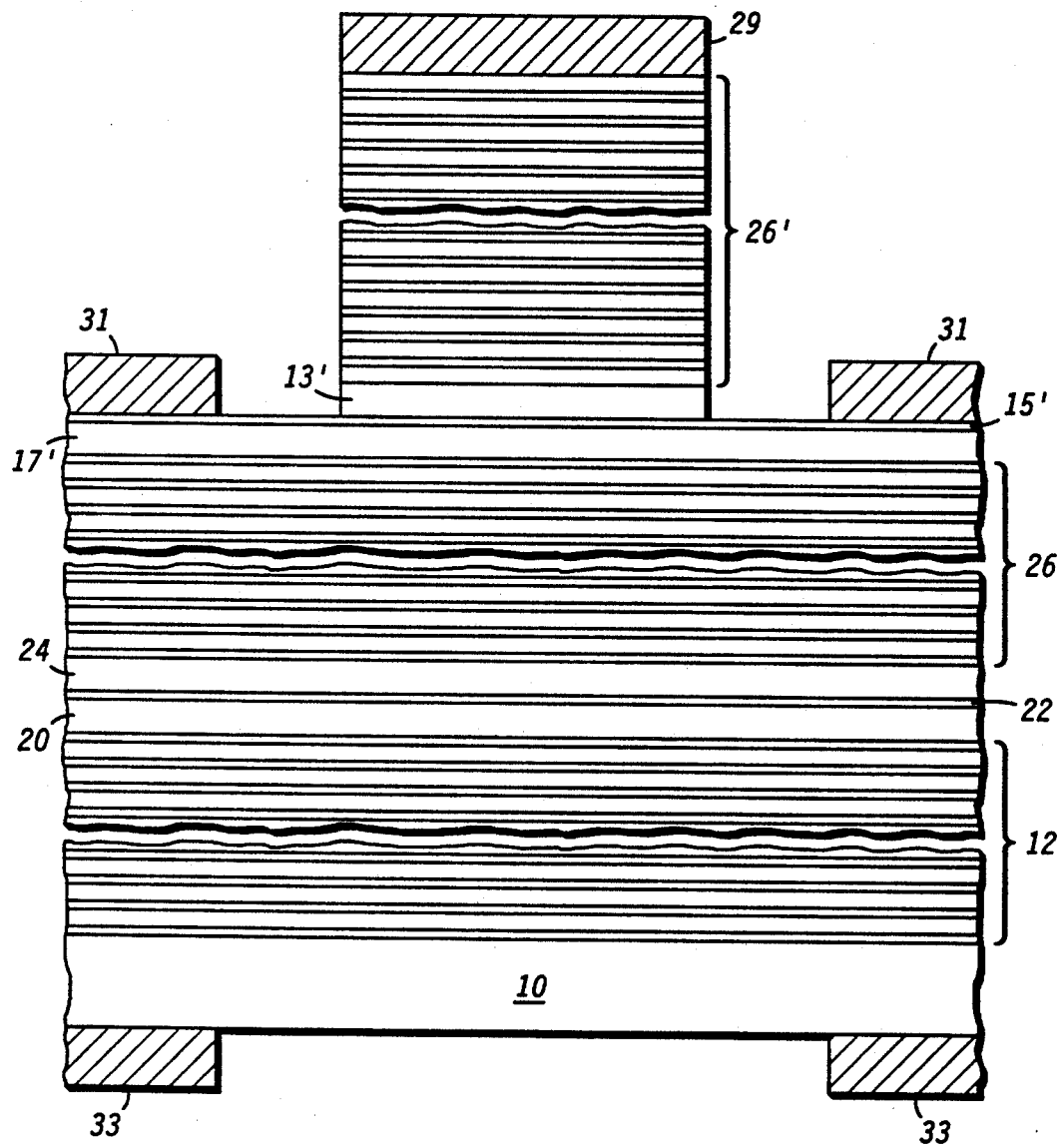
FIG. 4 illustrates an enlarged cross-sectional view of a second embodiment of the present invention.

FIG. 4 illustrates an enlarged cross-sectional view of a second embodiment of the present invention. The structure of FIG. 4 is processed in much the same manner as the structure of FIGS. 1-3, except that the HBT is positioned within the second ¼ wave stack of the VCSEL. Layers which are the same as those shown in FIGS. 1-3 are referenced by the same numerals. In this embodiment, the HBT is comprised of a collector layer 17', a base layer 15', and an emitter layer 13'. The HBT layer in this embodiment are exactly like the HBT layers of the first embodiment, except that collector layer 17' and emitter 15' are reversed. The second ¼ wave stack is shown in two portions—a first portion of second ¼ wave stack 26 and a second portion of second ¼ wave stack 26'. As in the first embodiment, a portion of the layers above base layer 15' are removed in order to make contact to base layer 14'. This embodiment forms a more planar structure than the first embodiment.

FIG. 5 illustrates an enlarged cross-sectional view of a third embodiment of the present invention in a beginning stage of fabrication. Layers which are the same as those shown in the first embodiment are referenced by the same numerals. In this embodiment, dielectric layers are utilized rather than semiconductor epitaxial layers for a second ¼ wave stack 28. Second ¼ wave stack 28 may be formed by, for example, plasma chemical vapor deposition, electron beam evaporation, or sputtering. In a preferred embodiment, second ¼ wave stack 28 is a dielectric mirror stack which is comprised of alternating silicon and silicon dioxide layers, where the silicon is undoped amorphous silicon. However, other dielectric layers such as silicon nitride or alumina ($Al_2O_3$) may be used. The formation of dielectric stacks, in general, is well known in the art.

Second ¼ wave stack 28 is shown already patterned by a masking layer 30 which was formed on second ¼ wave stack 28. Masking layer 30 is preferably comprised of photoresist, however, other materials may be used. Methods of patterning second ¼ wave stack 28 are known in the art. Thereafter, isolation region 35 is formed in a portion of second portion of first ¼ wave stack 12'. Isolation region 35 may be comprised of dopants of the second conductivity type or protons ion implanted through layers 24 and 22. For this process, both masking layer 30 and second ¼ wave stack 28 are utilized as masking layers. Isolation region 35 may not be required for some applications. Isolation region 35 is formed to provide current and optical confinement to prevent shadowing from ohmic contacts 39 (shown in FIG. 7).

FIG. 6 illustrates the structure of FIG. 5 in a further stage of fabrication. Masking layer 30 is removed and another masking layer 37 is formed over second ¼ wave stack 28 and on a portion of layer 24. Thereafter, portions of layers 24, 22, 20, 35, 12', and 17 which are not protected by masking layer 37 are removed in order to expose base layer 15 of the HBT. This etch process may be done by using conventional methods well known in the art.

Figure 7:
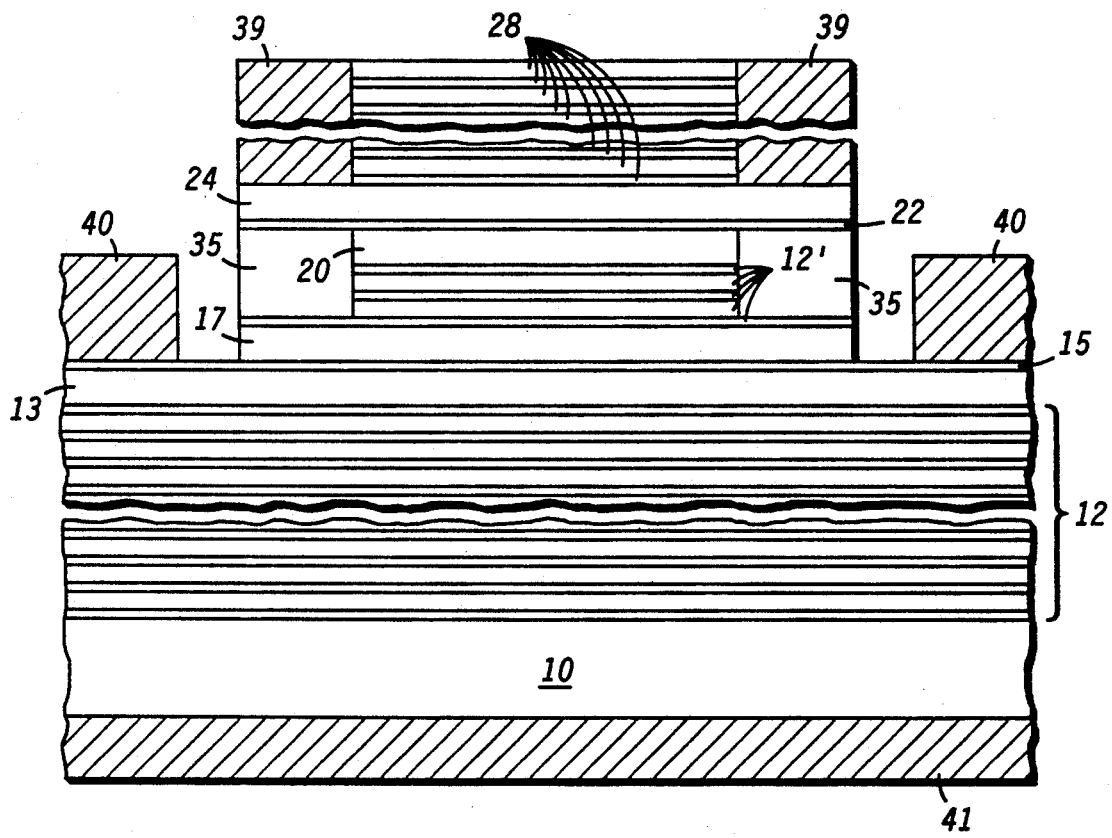
FIG. 7 illustrates an enlarged cross-sectional view of the third embodiment of the present invention in yet a further stage of fabrication.

FIG. 7 illustrates the structure of FIG. 6 in yet a further stage of fabrication. Masking layer 37 is first removed. Second conductivity type ohmic contacts 39 and 40 are then formed on second cladding layer 24 and base layer 15, respectively, while a first conductivity type ohmic contact 41 is formed on the exposed portion of self-supporting structure 10.

In this embodiment, a top emitting device is formed, wherein optical emission takes place through dielectric ¼ wave stack 28. In addition, a more planar structure can be obtained by using dielectric layers in the second ¼ wave stack 28, rather than semiconductor epitaxial layers as shown in FIG. 3.

Figure 8:
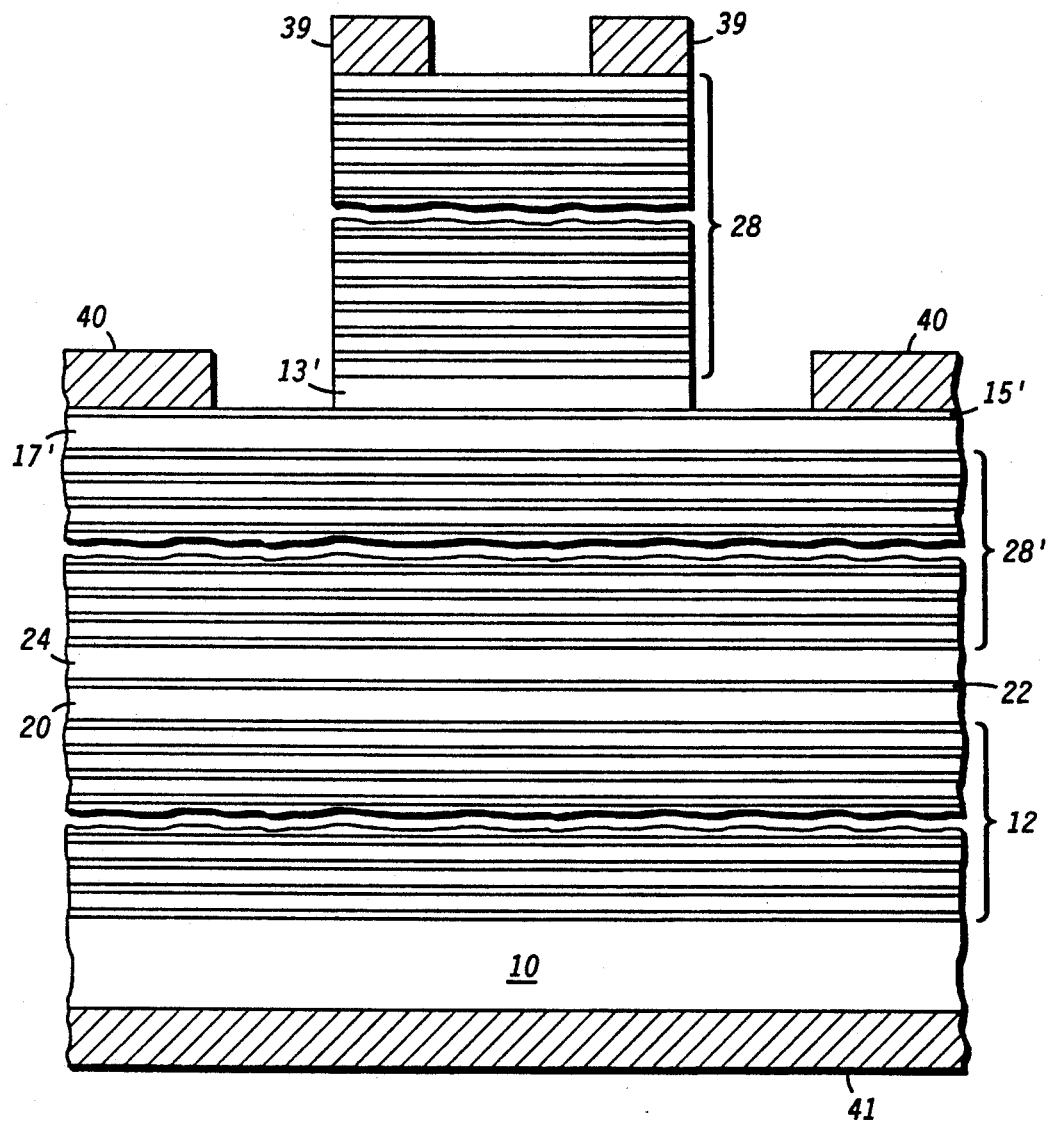
FIG. 8 illustrates an enlarged cross-sectional view of a fourth embodiment of the present invention.

FIG. 8 illustrates an enlarged cross-sectional view of a fourth embodiment of the present invention. The structure of FIG. 8 is processed in much the same manner as the structure of FIGS. 5-7, except that isolation region 35 is not formed and the HBT is positioned within the second ¼ wave stack of the VCSEL. This embodiment is also similar the second embodiment shown in FIG. 4. Layers which are the same as that shown in FIGS. 5-7 or FIG. 4 are referenced by the same numerals. In this embodiment, the HBT is comprised of a collector layer 17', a base layer 15', and an emitter layer 13'. The second ¼ wave stack is shown in two portions—a first portion of second ¼ wave stack 28' and a second portion of second ¼ wave stack 28. Second portion of second ¼ wave stack 28 is comprised dielectric layers like in the third embodiment shown in FIG. 7. First portion 28' is comprised of semiconductor epitaxial layers like in the first embodiment shown in FIG. 1. As in the first embodiment, a portion of the layers above base layer 15' are removed in order to make ohmic contact to base layer 15'. In this embodiment, a separate contact (second conductivity type ohmic contacts 39 in FIG. 7) to cladding layer 24 is not needed. This embodiment forms a more planar structure than the third embodiment.

By now it should be appreciated that there has been provided an improved OEIC and method of manufacture. In the present invention, the HBT is partially or fully positioned within one of the ¼ wave stacks of the VCSEL. This structure provides for direct drive of the VCSEL by the HBT; the HBT does not have to be electrically connected to the VCSEL by metal interconnects. In addition, planarity can be improved by positioning the HBT in the second ¼ wave stack of the VCSEL. Because the HBT layers also function as part of one of the ¼ wave stacks, a structure more planar than prior art devices can be fabricated. The more planar structure allows for high performance circuits to be fabricated. Furthermore, additional transistors can be easily fabricated, allowing for higher levels of integration and functionality.

We claim:

1. An integrated circuit, comprising:
   a vertical cavity surface emitting laser comprised of a first ¼ wave stack, an active layer, and a second ¼ wave stack; and
   a heterojunction bipolar transistor partially or fully positioned within either the first or the second ¼ wave stack of the vertical cavity surface emitting laser.

2. The integrated circuit of claim 1 wherein the heterojunction bipolar transistor is positioned within the first ¼ wave stack to obtain optimum structural, electrical, and optical characteristics of the integrated circuit.

3. The integrated circuit of claim 1 wherein the heterojunction bipolar transistor is positioned within the second ¼ wave stack to obtain optimum structural, electrical, and optical characteristics of the integrated circuit.

4. The integrated circuit of claim 1 wherein the vertical cavity surface emitting laser is further comprised of a cladding layer positioned between the first ¼ wave stack and the active layer, and wherein the HBT is comprised of an emitter layer, a base layer and a collector layer, and wherein the collector layer and the cladding layer are the same layer and the emitter layer and the base layer also act as a part of the first ¼ wave stack.

5. The integrated circuit of claim 1 wherein the second ¼ wave stack is comprised of dielectric layers.

6. An integrated circuit, comprising:
   a self supporting structure;
   a first ¼ wave stack formed on the self-supporting structure;
   a first cladding layer formed on the first ¼ wave stack;
   an active layer formed on the first cladding layer;
   a second cladding layer formed on the active layer; and
   a second ¼ wave stack formed on the second cladding layer; and
   a heterojunction bipolar transistor partially or fully positioned within either the first or the second ¼ wave stack, wherein the heterojunction bipolar transistor is comprised of an emitter layer, a base layer, and a collector layer.

7. The integrated circuit of claim 6 wherein:
   the self-supporting structure is comprised of gallium arsenide;
   the first ¼ wave stack is comprised of alternating layers of aluminum arsenide and gallium arsenide;
   the emitter and the collector layers are comprised of aluminum arsenide and the base layer is comprised of gallium arsenide;
   the first cladding layer is comprised of AlGaAs;
   the active layer is comprised of barrier layers and at least one quantum well;
   the second cladding layer is comprised of AlGaAs; and
   the second ¼ wave stack is comprised of alternating layers of aluminum arsenide and gallium arsenide.

8. The integrated circuit of claim 6 wherein:
   the self-supporting structure is comprised of gallium arsenide;
   the first ¼ wave stack is comprised of alternating layers of aluminum arsenide and gallium arsenide;
   the emitter and collector layers are comprised of aluminum arsenide and the base layer is comprised of gallium arsenide;
   the first cladding layer is comprised of aluminum gallium arsenide;
   the active layer is comprised of barrier layers and at least one quantum well;
   the second cladding layer is comprised of aluminum gallium arsenide; and the second ¼ wave stack is comprised of dielectric layers.

9. The integrated circuit of claim 6 wherein the heterojunction bipolar transistor is positioned within the first ¼ wave stack to obtain optimun structural, electrical, and optical characteristics of the integrated circuit.

10. The integrated circuit of claim 6 wherein the heterojunction bipolar transistor is positioned within the second ¼ wave stack to obtain optimum structural, electrical, and optical characteristics of the integrated circuit.

11. The integrated circuit of claim 6 wherein the vertical cavity surface emitting laser is further comprised of a cladding layer and wherein the HBT is comprised of an emitter layer, a base layer and a collector layer, and wherein the collector and the cladding layer are the same layer and the emitter layer and the base layer also act as a part of the first ¼ wave stack.

12. The integrated circuit of claim 6 wherein the second ¼ wave stack is comprised of dielectric layers.

13. The integrated circuit of claim 6 further comprising an isolation region formed in a portion of the first ¼ wave stack to provide current and optical confinement and wherein the HBT is positioned below the isolation region.

14. An integrated circuit, comprising:
a vertical cavity surface emitting laser comprised of a first ¼ wave stack, an active layer and a second ¼ wave stack; and
a heterojunction bipolar transistor, wherein the heterojunction bipolar transistor is a part of either the first or the second ¼ wave stack.

15. An integrated circuit, comprising:
a vertical cavity surface emitting laser comprised of an optical cavity; and
a heterojunction bipolar transistor positioned within the optical cavity.

16. A method of making an integrated circuit, comprising the steps of:
providing a self-supporting structure;
forming a vertical cavity surface emitting laser comprised of a first ¼ wave stack, an active layer, and a second ¼ wave stack on the self-supporting structure; and
forming a heterojunction bipolar transistor partially or fully positioned within either the first or the second ¼ wave stack of the vertical cavity surface emitting laser.

17. The method of claim 16 wherein the step of forming the heterojunction bipolar transistor is comprised of positioning the heterojunction bipolar transistor within the first ¼ wave stack to obtain optimum structural, electrical, and optical characteristics of the integrated circuit.

18. The method of claim 16 wherein the step of forming the heterojunction bipolar transistor is comprised of positioning the heterojunction bipolar transistor within the second ¼ wave stack to obtain optimum structural, electrical, and optical characteristics of the integrated circuit.

19. The method of claim 16 further comprising the step of forming a cladding layer between the first ¼ wave stack and the active layer, and wherein the heterojunction bipolar transistor is comprised of an emitter layer, a base layer and a collector layer, and wherein the collector layer and the cladding layer are the same layer and the emitter layer and the base layer act as a part of the first ¼ wave stack.

20. The method of claim 16 wherein the step of forming the second ¼ wave stack is comprised of forming dielectric layers.

21. The method of claim 16 wherein the step of forming the second ¼ wave stack is comprised of forming dielectric layers and semiconductor epitaxial layers.

* * * * *